United States Patent [19]
Tanino

[11] Patent Number: 5,352,998
[45] Date of Patent: Oct. 4, 1994

[54] MICROWAVE INTEGRATED CIRCUIT HAVING A PASSIVE CIRCUIT SUBSTRATE MOUNTED ON A SEMICONDUCTOR CIRCUIT SUBSTRATE

[75] Inventor: Noriyuki Tanino, Itami, Japan

[73] Assignee: Mitsubishi Denki Kabushiki Kaisha, Tokyo, Japan

[21] Appl. No.: 130,555

[22] Filed: Oct. 1, 1993

[30] Foreign Application Priority Data

Oct. 9, 1992 [JP] Japan .................................. 4-298137

[51] Int. Cl.$^5$ ............................................ H01L 23/12
[52] U.S. Cl. ...................................... 333/247; 29/830; 257/691; 257/728; 330/286; 330/307
[58] Field of Search .................. 333/246, 247; 29/830; 330/286, 307; 257/659, 660, 664, 691, 728

[56] References Cited

U.S. PATENT DOCUMENTS 4,673,958  6/1987  Bayraktaroglu ............... 333/247 X
4,692,791  9/1987  Bayraktaroglu ............... 333/247 X
5,049,978  9/1991  Bates et al. .................... 333/247 X Primary Examiner—Paul Gensler
Attorney, Agent, or Firm—Leydig, Voit & Mayer

[57] ABSTRACT

A microwave integrated circuit includes a semiconductor substrate having semiconductor elements, such as transistors, diodes, resistors, and the like, and a passive circuit substrate having passive circuit elements, such as microstrip or coplanar transmission lines, spiral inductors, capacitances, and the like, on its front surface. The passive circuit substrate is mounted on the semiconductor substrate so that the rear surface of the passive circuit substrate faces the surface of the semiconductor substrate on which the semiconductor elements are present, and the semiconductor elements are electrically connected to the elements or grounding conductors of the passive circuit substrate via through-holes or bumps. The passive circuit substrate includes a thin dielectric film having less dielectric loss than the semiconductor substrate, and the passive circuit elements, especially the transmission lines, are disposed on the dielectric substrate. Therefore, the transmission lines have a very small loss in a range from microwave to millimeter-wave frequency bands.

12 Claims, 6 Drawing Sheets

Fig. 6 (a)  Prior Art
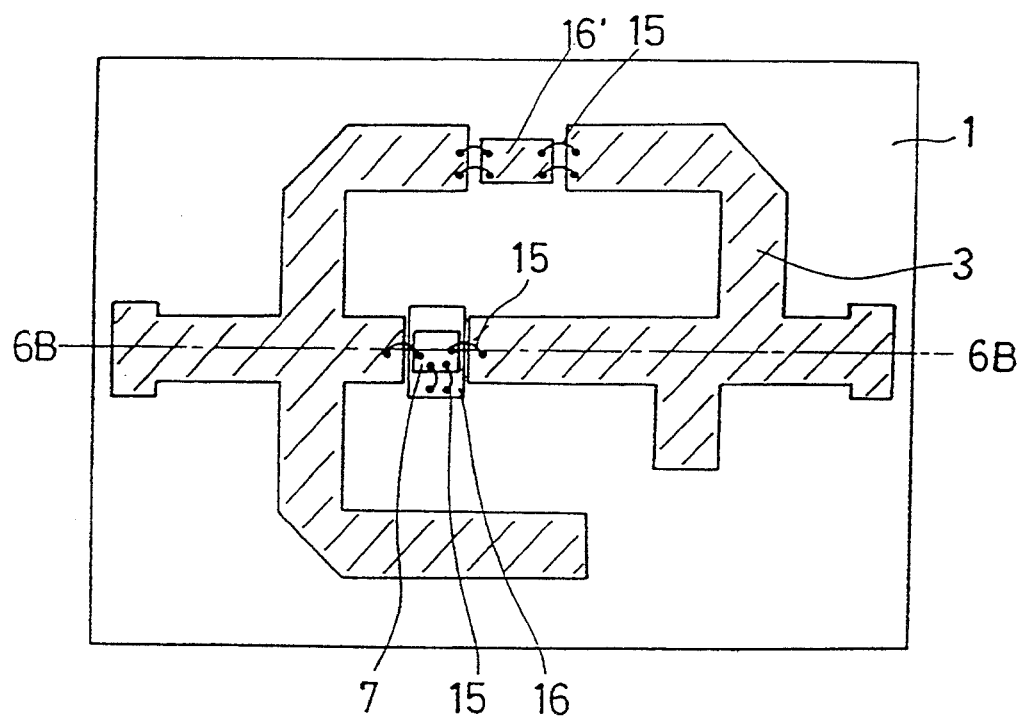
Fig. 6 (b)  Prior Art
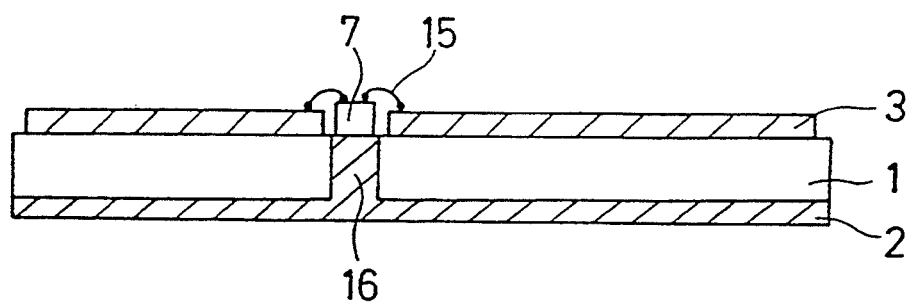

MICROWAVE INTEGRATED CIRCUIT HAVING A PASSIVE CIRCUIT SUBSTRATE MOUNTED ON A SEMICONDUCTOR CIRCUIT SUBSTRATE

FIELD OF THE INVENTION

The present invention relates to a microwave integrated circuit in which passive circuit elements including microstrip transmission lines are disposed on a dielectric substrate while active circuit elements are disposed on a semiconductor substrate.

BACKGROUND OF THE INVENTION

FIG. 6(a) is a plan view illustrating a conventional microwave integrated circuit (hereinafter referred to as MIC) and FIG. 6(b) is a cross-sectional view taken along line 6B—6B of FIG. 6(a). In the figures, reference numeral 1 designates a dielectric substrate. A conductor 2 is disposed on the rear surface of the dielectric substrate 1. A microstrip line conductor (or a coplanar line conductor) 3 using the conductor 2 as a grounding conductor is disposed on the surface of the dielectric substrate 1. Through-hole electrodes 16 and 16' penetrate portions of the dielectric substrate 1 and connect to the conductor 2. A semiconductor chip 7 is disposed on the through-hole electrode 16 and connected to the microstrip line conductor 3 by wires 15. The semiconductor chip includes transistors, diodes, resistances, and the like, which are fabricated on a semiconductor substrate. The through-hole electrode 16' is connected to the microstrip line conductor 3 by wires 15.

FIG. 7(a) is a plan view illustrating a conventional microwave monolithic integrated circuit (hereinafter referred to as MMIC) and FIG. 7(b) is a cross-sectional view taken along line 7B—7B of FIG. 7(a). In the figures, reference numeral 8 designates a semiconductor substrate. A transistor 12 is disposed in a surface region of the semiconductor substrate 8. A conductor 2 is disposed on the rear surface of the semiconductor substrate 8. A microstrip line conductor 3 using the conductor 2 as a grounding conductor is disposed on the front surface of the semiconductor substrate 8 and connected to the transistor 12. The source of the transistor 12 and the end portions of the microstrip line 3 are grounded by via-hole conductors 5.

The conventional MIC of FIGS. 6(a) and 6(b) has the following drawbacks.

(1) Although FIGS. 6(a) and 6(b) illustrate a single stage amplifier including one transistor 7, in case of a two or more stage amplifier including a plurality of semiconductor elements, the number of nodes connecting the semiconductor elements to the microwave transmission line increases and a lot of wires are needed, increasing production costs and reducing reliability.

(2) The wire 15 is used for connecting the microwave transmission line 3 to the semiconductor element 7, and the inductance of the wire is not negligible in a high frequency band, i.e., at sub-millimeter wavelengths. In addition, variations in the lengths of the wires 15 cause variations in the characteristics of the MIC, i.e., amplification characteristics, VSWR (Voltage Standing Wave Ratio) of the input, gain, output power, noise factor, and the like.

(3) The semiconductor element 7 is disposed on the through-hole conductor 16 for grounding and heat radiation. However, heat generated in the semiconductor element 7 does not diffuse transverse to the through-hole conductor 16, and thermal stress is caused by the difference in the thermal expansion coefficients between the material of the through-hole conductor 16 and the material of the dielectric substrate 1, resulting in poor heat radiation of the semiconductor element that reduces saturation power output (maximum power output) and power application efficiency.

On the other hand, the MMIC of FIGS. 7(a) and 7(b) has the following drawbacks.

(1) Since the microstrip line conductor 3 is disposed on the semiconductor substrate 8 which has a large dielectric loss, the line loss increases. For example, a GaAs substrate has a dielectric loss tangent (tan$\delta$) of 0.001.

(2) Since the semiconductor substrate 8 must be as thick as 100 microns so that the microwave transmission line 3 has a desired characteristic impedance, the heat radiation of the semiconductor element is poor, reducing the saturation output and power application efficiency.

(3) Since the process steps for fabricating the semiconductor element 12 and the microstrip line conductor 3 on the semiconductor substrate 8 are serially carried out, the production yield, which is determined by multiplying the yields of the respective steps, is reduced. In addition, the uneven surface of the substrate due to the presence of semiconductor elements causes uneven deposition of photoresist in subsequent steps for producing passive circuit elements. Therefore, the application of the photoresist must be divided into two steps to reduce the unevenness of the substrate surface which requires an advanced surface flattening technique and severe production conditions, resulting in an increase in the production cost.

SUMMARY OF THE INVENTION

It is an object of the present invention to provide a microwave integrated circuit having high reliability, that is easily produced and has improved heat radiation characteristics for semiconductor elements and small dielectric loss.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first embodiment of the present invention, a microwave integrated circuit includes a semiconductor substrate having semiconductor elements, such as transistors, diodes, resistors, and the like, and a passive circuit substrate having passive circuit elements, such as microstrip or coplanar transmission lines, spiral inductors, capacitances, and the like, on a front surface. The passive circuit substrate is mounted on the semiconductor substrate so that the rear surface of the passive circuit substrate faces the surface of the semiconductor substrate on which the semiconductor elements are present, and the semiconductor elements are electrically connected to the elements or grounding conductors of the passive circuit substrate via through-holes or bump electrodes. The passive circuit substrate comprises a thin dielectric film having lower dielectric loss than the semiconductor substrate, and the passive circuit elements, especially the transmission lines, are disposed on the dielectric substrate. Therefore, the transmission lines have a very small loss in a range from microwave to millimeter-wave frequency band.

Since the active elements, such as transistors, are all disposed on the same semiconductor substrate, variations in electrical characteristics amongst the active elements are reduced, and the respective gate and drain bias voltages are the same for all the transistors.

Since at least part of the DC bias circuit including the gate bias circuit and the drain bias circuit is integrated on the semiconductor substrate, the number of junctions between the semiconductor elements and the passive circuit substrate is reduced.

Since the transmission lines are not disposed on the semiconductor substrate, the semiconductor substrate may be as thin as 20 microns. When a heat sink is adhered to the rear surface of the semiconductor substrate, the thermal resistance of the substrate is reduced, resulting in a high-output and high-efficiency microwave integrated circuit.

Since the semiconductor circuit substrate is connected to the rear surface of the passive circuit substrate, the top surface of the passive circuit substrate where the transmission lines are present is open, preventing electromagnetic field coupling between the passive circuit substrate and the semiconductor substrate that varies the characteristics of the transmission line and increases loss.

BRIEF DESCRIPTION OF THE DRAWINGS

FIGS. 6(a) and 6(b) are a plan view and a sectional view, respectively, illustrating an MIC in accordance with the prior art;

DETAILED DESCRIPTION OF THE PREFERRED EMBODIMENTS

Figure 1:
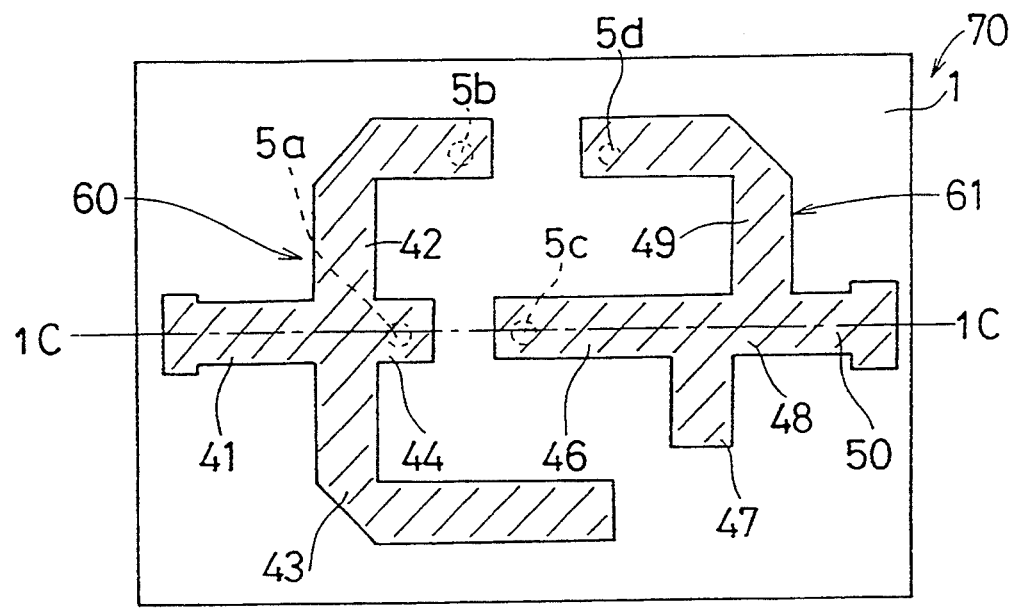
FIGS. 1(a)-1(c) are a plan view, a bottom view, and a sectional view illustrating a passive circuit substrate included in a microwave integrated circuit in accordance with a first embodiment of the present invention.
Figure 1:
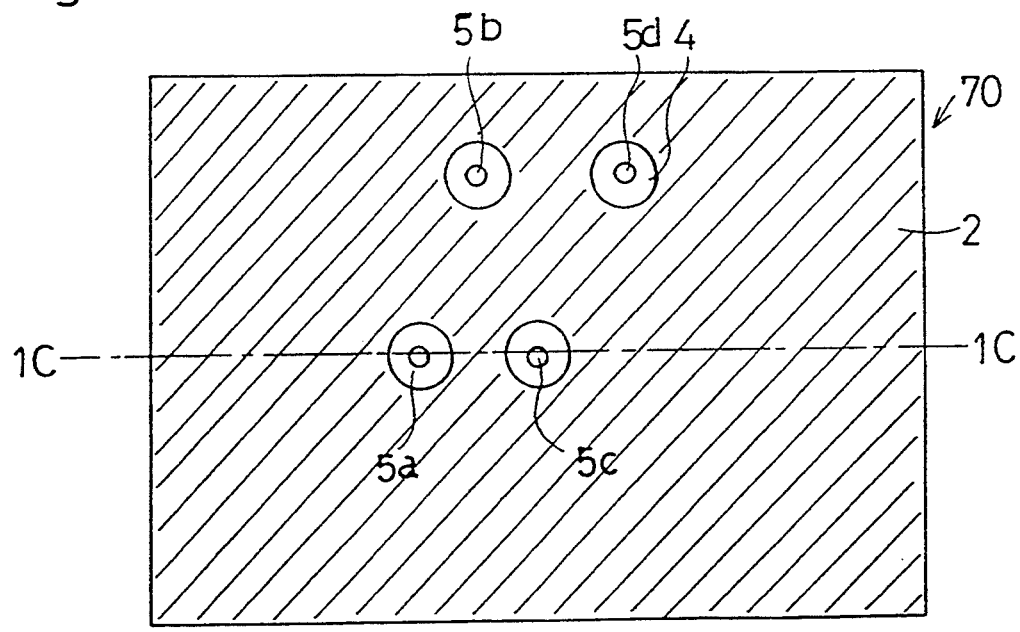
Figure 1:
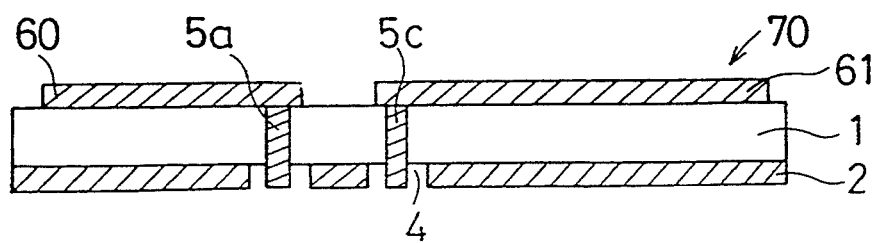

FIGS. 1(a) to 1(c) are diagrams illustrating a substrate with passive circuit elements (hereinafter referred to as passive circuit substrate) included in a microwave integrated circuit in accordance with a first embodiment of the present invention, in which FIG. 1(a) is a plan view, FIG. 1(b) is a bottom view, and FIG. 1(c) is a sectional view taken along line 1C–1C of FIG. 1(a). Reference numeral 1 designates a thin dielectric film 100 200 microns thick. Preferably, the dielectric film 100 comprises polyimide. The dielectric loss tangent of the polyimide substrate is about $10^{-5}$. A thin conductive film 2 is disposed on the rear surface of the thin dielectric film 1. Matching circuits 60 and 61 comprising microstrip transmission lines using the thin conductive film 2 as the grounding conductor are disposed on the surface of the thin dielectric film 1. Openings 4 penetrate through prescribed portions of the thin conductive film 2. Through-hole conductors 5a to 5d penetrate through the thin dielectric film 1, and an end of each through-hole conductor is connected to the matching circuit 60 or 61 while the other end protrudes in the corresponding opening 4.

Figure 8:
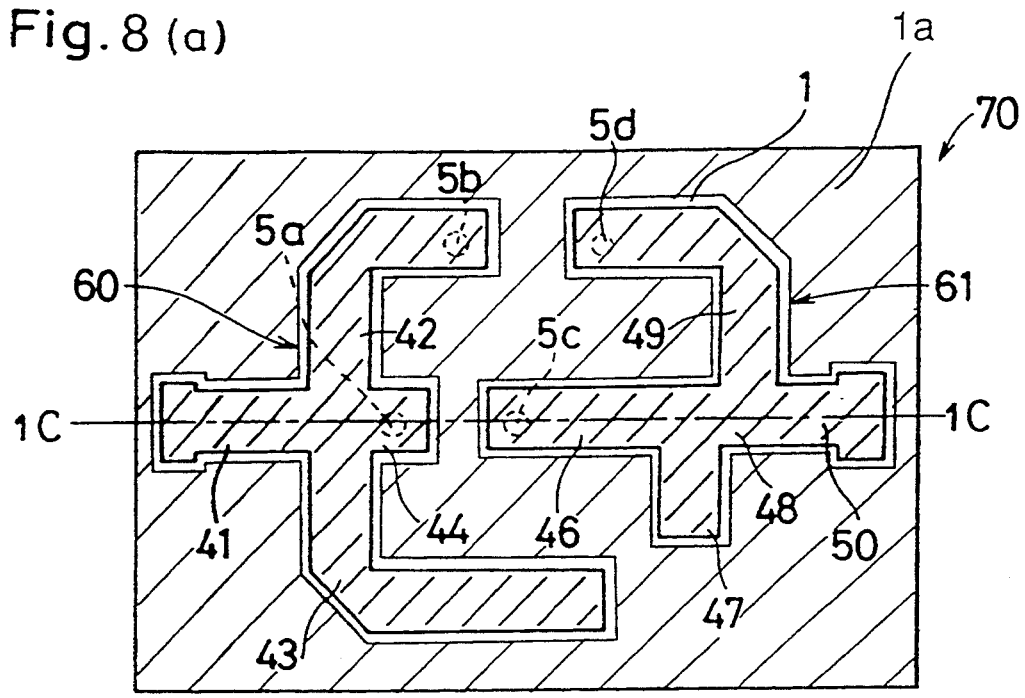
FIGS. 8(a)-8(c) are a plan view, a bottom view, and a sectional view illustrating a passive circuit substrate included in a microwave integrated circuit according to a variation of the first embodiment of the present invention.
Figure 8:
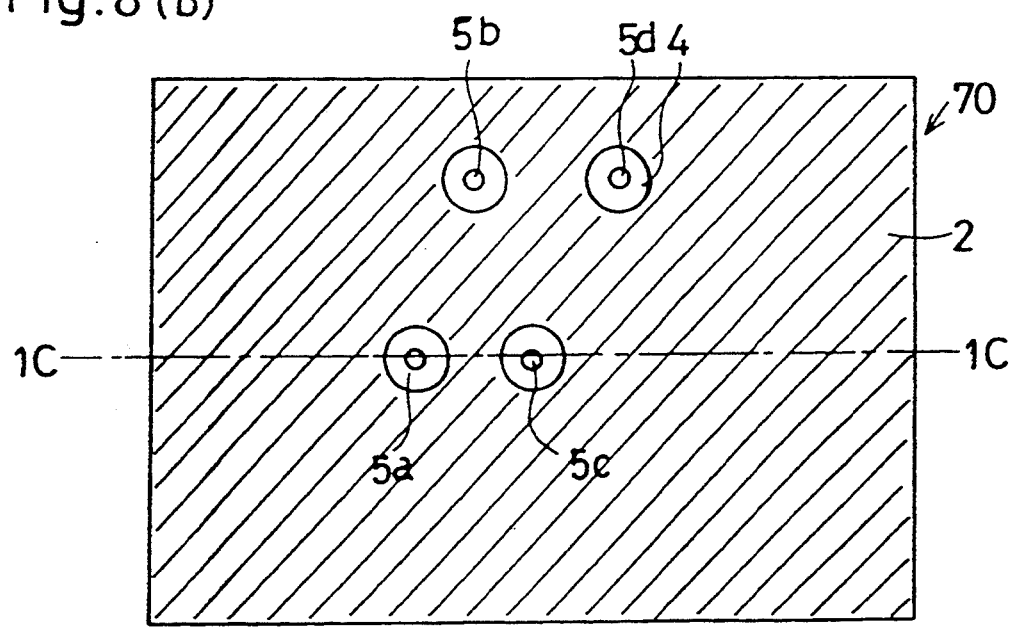
Figure 8C:
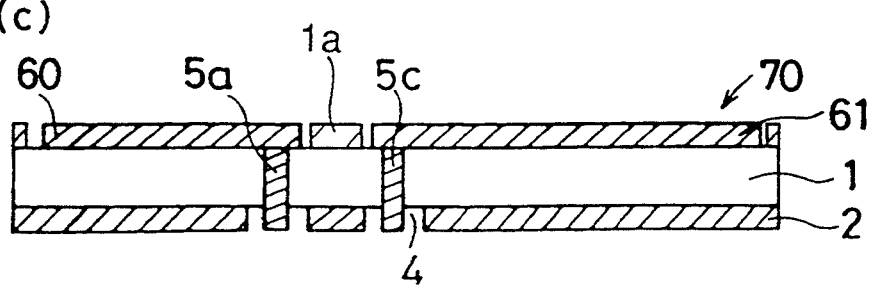

FIGS. 8(a)-8(c) are diagrams illustrating a passive circuit substrate in accordance with a variation of the first embodiment of the present invention in which the matching circuits 60 and 61 comprise coplanar transmission lines. In the figures, the same reference numerals as in FIGS. 1(a)-1(c) designate the same parts. Reference numeral 1a designates a grounding conductor.

Figure 2:
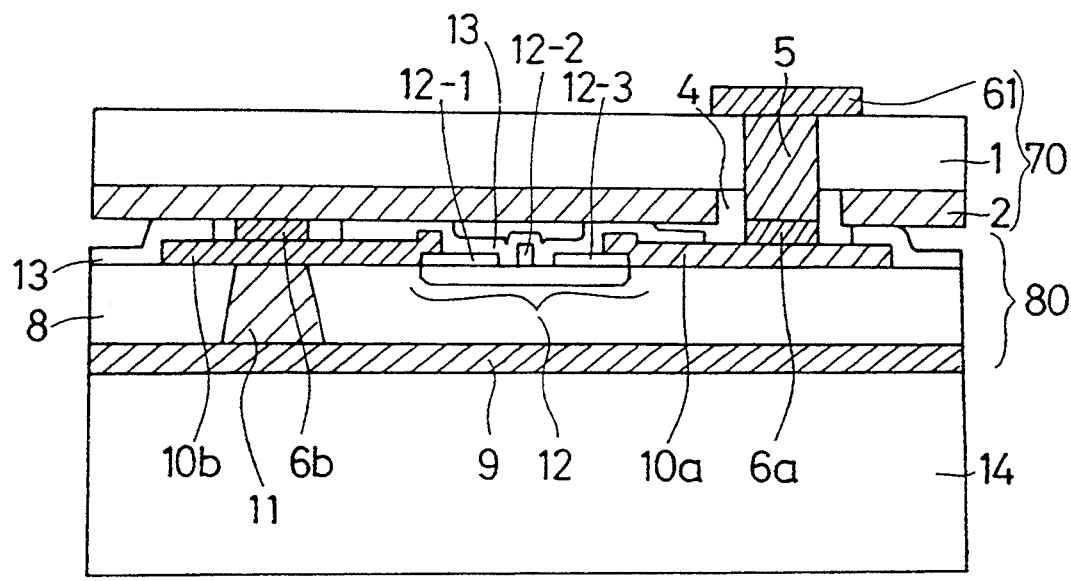
FIG. 2 is a sectional view illustrating an MIC in accordance with the first embodiment of the present invention.

FIG. 2 is a sectional view illustrating the passive circuit substrate 70 of FIGS. 1(a)-1(c) mounted on a semiconductor substrate. In the figure, reference numeral 8 designates a semiconductor substrate about 20~200 microns thick comprising GaAs, Si, or the like. A thin conductive film 9 serving as a grounding conductor is disposed on the rear surface of the semiconductor substrate 8. Electrodes 10a and 10b are disposed on the surface of the semiconductor substrate 8. The electrode 10b is connected to the thin conductive film 9 by a via-hole 11. A transistor 12 disposed on the surface of the semiconductor substrate 8. Reference numerals 12-1, 12-2, and 12-3 designate source, gate, and drain electrodes of the transistor 12, respectively. Reference numeral 13 designates an insulating film for protecting the transistor 12. A semiconductor circuit substrate 80 includes the semiconductor substrate the transistor 12, and the grounding conductor 9, and it identical to the prior art MMIC except that the microstrip transmission line is absent.

When the passive circuit substrate 70 is mounted on the semiconductor circuit substrate 80, the through-hole conductor 5 of the substrate 70 is connected through a bump electrode 6a to the electrode 10a. The electrode 10a is connected to the drain 12-3 of the transistor 12, and the grounding conductor 2 of the substrate 70 is connected through a bump electrode 6b to the electrode 10b which electrode 10b is connected to the source 12-1 of the transistor 12. A heat sink 14 is adhered to the rear surface of the semiconductor circuit substrate 80 to improve heat radiation of the transistor 12.

Figure 4:
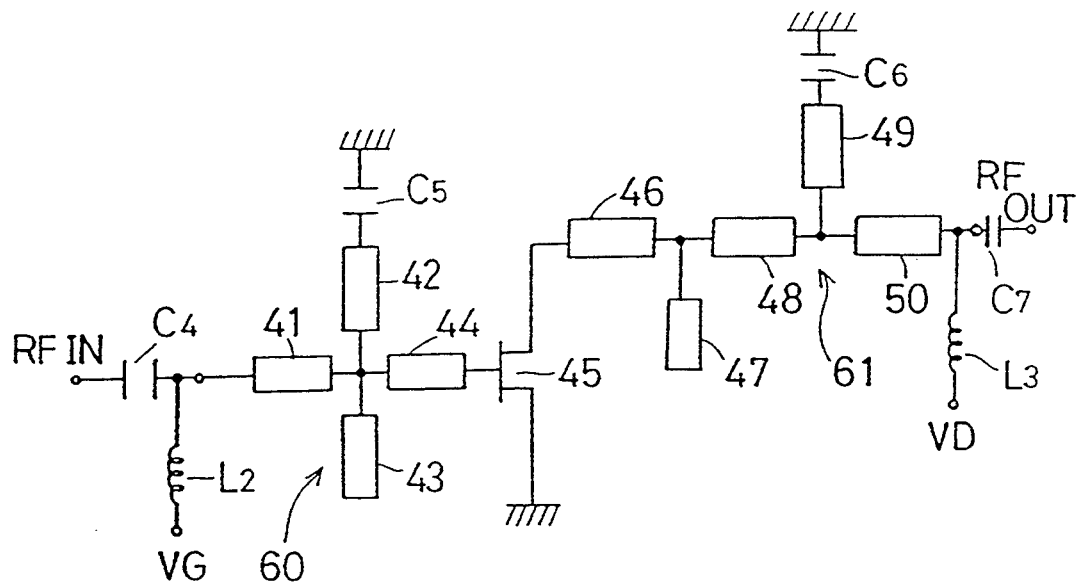
FIG. 4 is a circuit diagram illustrating a single stage amplifier circuit including the MIC of FIG. 2.

FIG. 4 is a circuit diagram illustrating a single stage amplifier circuit comprising the microwave integrated circuit of FIG. 2. In the figure, the input matching circuit 60 comprises transmission lines 41, 42, 43, and 44. A capacitor C5 is present on the semiconductor circuit substrate 80 via the through-hole electrode 5b of FIG. 1(a). An FET 45 is part of a single stage amplifier circuit. The output matching circuit 61 comprises transmission lines 46 to 50. A capacitor C6 is present on the semiconductor circuit substrate 80 via the through-hole conductor 5d of FIG. 1(a). In this circuit, an RF input $RF_{IN}$ and a gate bias voltage $V_G$ are applied to an input end of the matching circuit 60 of the passive circuit substrate 70 shown in FIG. 1(a) via the capacitor C4 and the inductance L2, respectively. On the other hand, a drain bias voltage $V_D$ is applied to an output end of the matching circuit 61 of the passive circuit substrate 70 and an RF output is output from the output end via the capacitor C7. The gate bias voltage $V_G$ and the drain bias voltage $V_D$ are applied to the transistor 12 on the semiconductor circuit substrate via the transmission lines of the dielectric substrate, but the $V_G$ and $V_D$ may be supplied via the resistors and capacitors on the semiconductor substrate.

Figure 3:
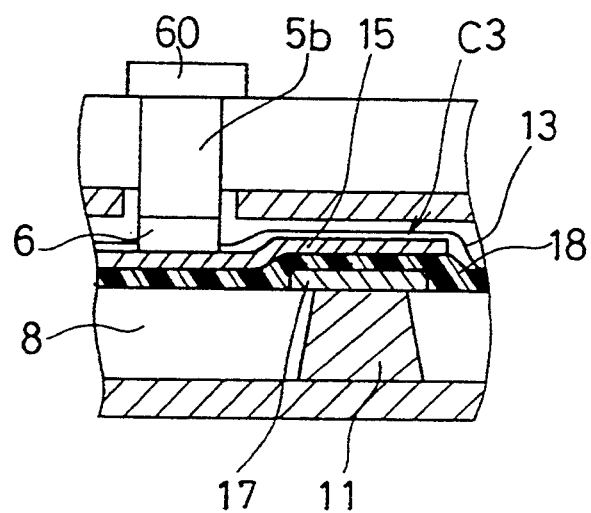
FIG. 3 is a sectional view illustrating a method of making a capacitor used in the MIC of FIG. 2.

FIG. 3 is a sectional view for explaining a method for producing a capacitor, such as the capacitor C5 or C6 of FIG. 4, on the semiconductor circuit substrate 80. Initially, a first conductive film 17 is formed on the via hole 11, and an insulating film 18 is formed on the semiconductor substrate 8 covering the first conductive film 17. Then, a second conductive film 15 is formed on the insulating film 18 and connected through the bump electrode 6 to the through-hole conductor 5b which is connected to the microstrip line 60. Thus, a capacitor C3 comprising the conductive films 17 and 15 and the insulating film 18 is completed.

In the single stage amplifier circuit of FIG. 4, the FET 45 disposed on the semiconductor substrate 8 is connected through the through-hole conductors 5 to the input matching circuit 60 and the output matching circuit 61 disposed on the passive circuit substrate 70. The gate bias $V_G$ and the drain bias $V_D$ are applied to the input and output matching circuits 60 and 61 via the coils L2 and L3, respectively, and the RF input $RF_{IN}$ is applied to the input matching circuit 60 on the dielectric substrate 1 via the capacitor C4. The RF input is amplified by the FET 45 and output from the output end of the output matching circuit 61 via the capacitor C7 as the RF output $RF_{OUT}$.

Figure 5:
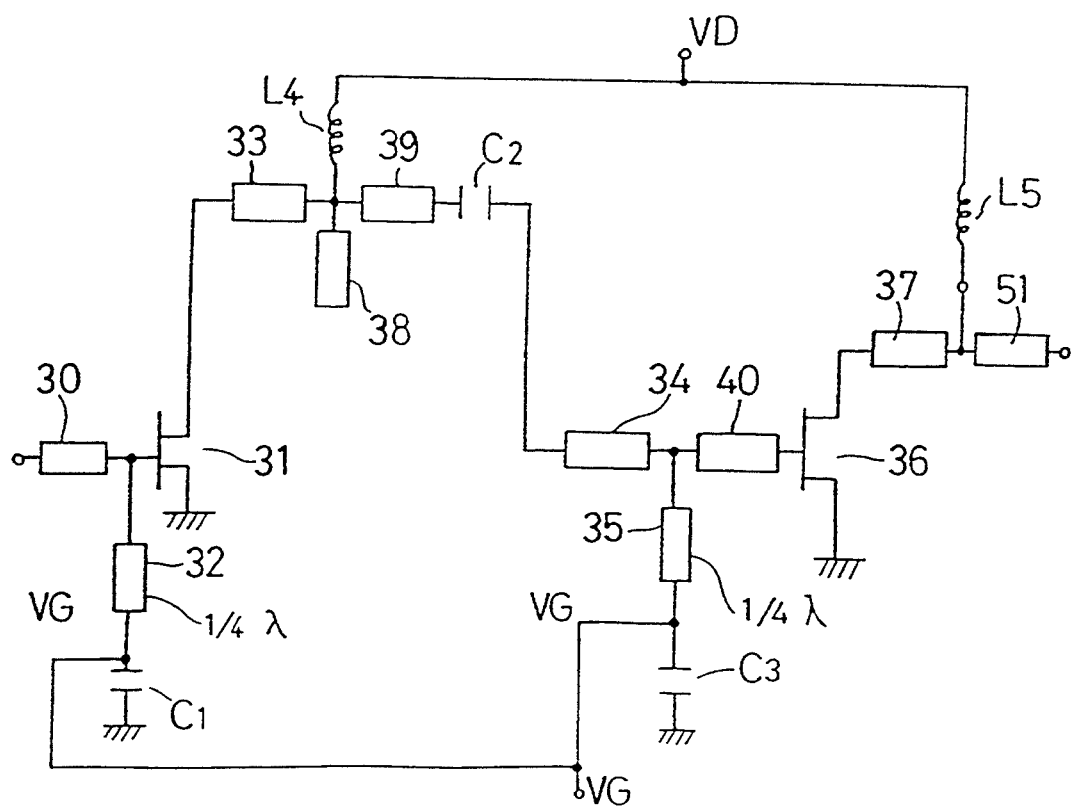
FIG. 5 is a circuit diagram illustrating a two stage amplifier circuit including the MIC of FIG. 2.
Figure 7A:
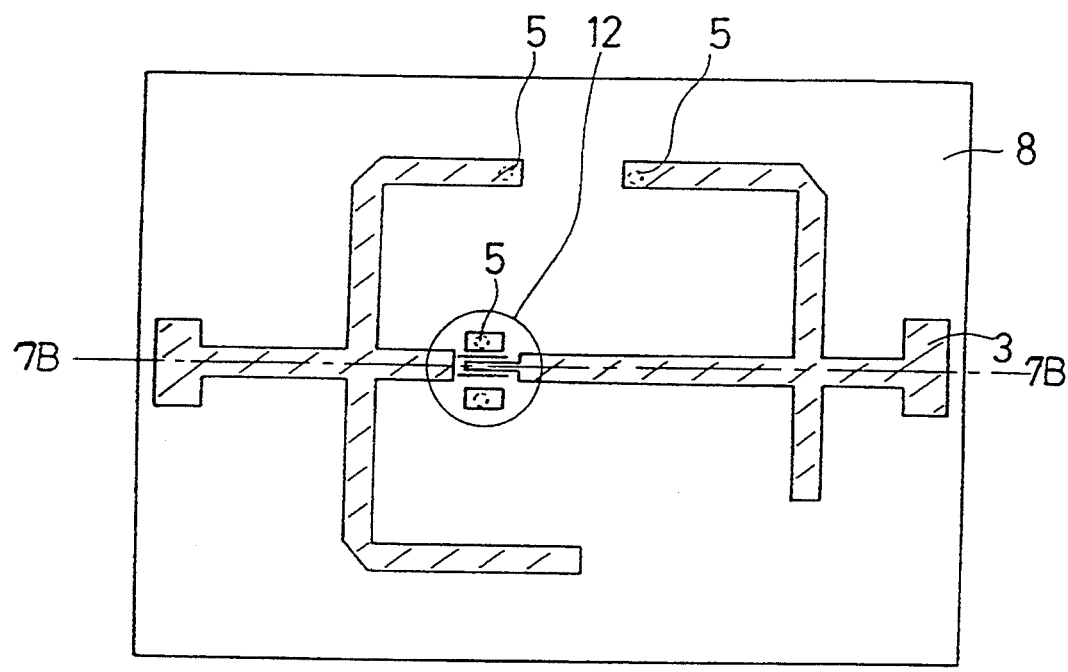
FIGS. 7(a) and 7(b) are a plan view and a sectional view, respectively, illustrating an MMIC in accordance with the prior art.
Figure 7B:
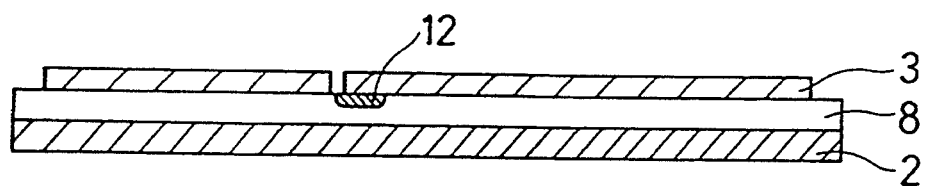

FIG. 5 is a circuit diagram illustrating a two stage amplifier circuit comprising the microwave integrated circuit of FIG. 2 in accordance with a second embodiment of the present invention. In the figure, reference numerals 30, 33, 38, 39, 34, 40, 37, and 51 designate transmission lines, numerals 31 and 36 designate FETs, numerals 32 and 35 designate ¼ wavelength lines, numerals L4 and L5 designate inductances, numerals C1 and C3 designate capacitors, and numeral C2 designates a coupling capacitor.

In the two stage amplifier circuit of FIG. 5, all of the transmission lines are disposed on the passive circuit substrate including the dielectric substrate 1. The gate bias $V_G$ is applied to the FET 31 via the capacitor C1 on the semiconductor substrate and the ¼ wavelength line 32 on the dielectric substrate 1 and to the FET 36 via the capacitor C3 on the semiconductor substrate and the ¼ wavelength line 35 on the dielectric substrate 1. Similarly, the drain bias $V_D$ is applied to the drain of the FET 31 via the inductance L4 and the transmission lines 33 and 38 on the dielectric substrate 1 and to the drain of the FET 36 via the inductance L5 and the transmission lines 37 and 40 on the dielectric substrate 1.

In the two stage amplifier circuit of FIG. 5, since the passive circuit elements are formed on the dielectric substrate 1 while the FETs 31 and 36 as active elements are formed on the semiconductor substrate 8, variations in electrical characteristics between the FETs 31 and 36 are reduced, and the gate bias voltage $V_G$ and the drain bias voltage $V_D$ applied to the transistor 31 can be equal to those applied to the transistor 36.

The microwave integrated circuits according to the first and second embodiments of the present invention have the following advantages.

(1) Since the microwave transmission lines of the input and output matching circuits 60 and 61 are fabricated on the passive circuit substrate 70 including the thin dielectric film 1, the dielectric loss caused by the transmission of microwaves through the transmission lines is significantly reduced, compared with the case where the transmission lines are fabricated on the semiconductor substrate. For example, the dielectric loss tangent of the dielectric substrate comprising polyimide is about $10^{-5}$ while the dielectric loss tangent of the conventional GaAs substrate is 0.001. Therefore, it is possible to form a transmission line with very small loss in a range from microwave to millimeter-wave bands.

(2) Since the semiconductor active elements, i.e., the transistors 31 and 36, are formed on the same semiconductor substrate, variations in electrical characteristics between the two transistors are reduced, and the gate bias voltage and the drain bias voltage are common to the transistors.

(3) It is possible to integrate all or part of the DC bias circuit on the semiconductor substrate. In this case, the number of nodes connecting the semiconductor elements to the passive circuit substrate is reduced.

(4) In the conventional MMIC in which the transmission line is disposed on the semiconductor substrate, since the characteristic impedance of the transmission line depends on the thickness of the substrate and the width of the transmission line, the semiconductor substrate must be as thick as 100 microns. In the present invention, however, since the transmission line is not disposed on the semiconductor substrate, the semiconductor substrate may be as thin as 20 microns. When such a thin substrate is fixed to a heat sink, the thermal resistance is significantly reduced and the heat radiation of the semiconductor element is significantly improved, resulting in a high-power output and high-efficiency microwave integrated circuit.

(5) Japanese Published Patent Applications Nos. 1-228202 and 2-122640 disclose MICs in which a semiconductor substrate including semiconductor elements, such as transistors, are mounted on a passive circuit substrate including passive circuit elements with the transistors facing the passive circuit elements. In this structure, electromagnetic field coupling occurs between the transistors and the passive circuit elements, which causes variations in electrical characteristics of the transistors. In the present invention, however, since the semiconductor circuit substrate is connected to the rear surface of the passive circuit substrate, the top surface of the passive circuit substrate where the transmission lines are present is not covered, so that no electromagnetic field coupling occurs between the passive circuit substrate and the semiconductor circuit substrate, preventing variations in the characteristics of the transmission lines and an increase in loss.

What is claimed is:

1. A microwave integrated circuit comprising:
a passive circuit substrate comprising a thin dielectric film having opposite first and second surfaces, a thin conductive film disposed on the second surface of said thin dielectric film, passive circuit elements having respective terminals disposed on the first surface of said thin dielectric film, the passive circuit elements including at least microstrip lines with said thin conductive film as a grounding conductor, openings penetrating through prescribed portions of said thin conductive film, and through-hole conductors having respective first and second ends and penetrating through portions of said thin conductive film, the first end of each through-hole conductor protruding from a corresponding opening of said thin conductive film and the second end contacting one of a terminal and a grounding conductor of a passive circuit element; and a semiconductor circuit substrate comprising a semiconductor substrate having opposite first and second surfaces, a thin conductive film disposed on the second surface of the semiconductor substrate, and active circuit elements having respective electrodes disposed on the first surface of the semiconductor substrate, wherein the passive circuit substrate is mounted on said semiconductor circuit substrate with the second surface of said passive circuit substrate facing the first surface of said semiconductor circuit substrate so that said through-hole conductors are electrically connected to electrodes of said active circuit elements.

2. The microwave integrated circuit of claim 1 wherein said dielectric film comprises polyimide.

3. The microwave integrated circuit of claim 1 comprising at least two transistors to which identical gate bias and drain bias voltages are applied.

4. The microwave integrated circuit of claim 1 wherein said semiconductor substrate has a thickness ranging from 20 microns to 200 microns.

5. The microwave integrated circuit of claim 1 including a heat sink on which said semiconductor circuit substrate is disposed.

6. A method of producing a microwave integrated circuit comprising:

preparing a dielectric substrate having opposite first and second surfaces;

forming a thin conductive film on the second surface of said dielectric substrate;

forming passive circuit elements having respective terminals on the first surface of said dielectric substrate, the passive circuit elements including at least microstrip lines with said thin conductive film as a grounding conductor;

forming openings penetrating through prescribed portions of said thin conductive film;

forming through-hole conductors having respective first and second ends penetrating through portions of said thin conductive film so that the first end of each through-hole conductor protrudes from a corresponding opening of said thin conductive film and the second end is in contact with one of a terminal and a grounding conductor of said passive circuit element;

preparing a semiconductor substrate having opposite first and second surfaces;

depositing a thin conductive film on the second surface of said semiconductor substrate;

forming active circuit elements having respective electrodes on the first surface of said semiconductor substrate;

attaching a heat sink to the second surface of the semiconductor substrate; and mounting said dielectric substrate on said semiconductor substrate with the second surface of said dielectric substrate facing the first surface of said semiconductor substrate and electrically connecting said through-hole conductors to electrodes of said active circuit elements.

7. A microwave integrated circuit comprising:

a passive circuit substrate comprising a thin dielectric film having opposite first and second surfaces, a thin conductive film disposed on the second surface of said thin dielectric film, passive circuit elements having respective terminals disposed on the first surface of said thin dielectric film, the passive circuit elements including at least coplanar transmission lines with said thin conductive film as a grounding conductor, openings penetrating through prescribed portions of said thin conductive film, and through-hole conductors having respective first and second ends and penetrating through portions of said thin conductive film, the first end of each through-hole conductor protruding from a corresponding opening of said thin conductive film and the second end contacting one of a terminal and a grounding conductor of a passive circuit element; and a semiconductor circuit substrate comprising a semiconductor substrate having opposite first and second surfaces, a thin conductive film disposed on the second surface of the semiconductor substrate, and active circuit elements having respective electrodes disposed on the first surface of the semiconductor substrate, wherein the passive circuit substrate is mounted on said semiconductor circuit substrate with the second surface of said passive circuit substrate facing the first surface of said semiconductor circuit substrate so that said though-hole conductors are electrically connected to electrodes of said active circuit elements.

8. The microwave integrated circuit of claim 7 wherein said dielectric film comprises polyimide.

9. The microwave integrated circuit of claim 7 comprising at least two transistors to which identical gate bias and drain bias voltages are applied.

10. The microwave integrated circuit of claim 7 wherein said semiconductor substrate has a thickness ranging from 20 microns to 200 microns.

11. The microwave integrated circuit of claim 7 including a heat sink on which said semiconductor circuit substrate is disposed.

12. A method of producing a microwave integrated circuit comprising:

preparing a dielectric substrate having opposite first and second surfaces;

forming a thin conductive film on the second surface of said dielectric substrate;

forming passive circuit elements having respective terminals on the first surface of said dielectric substrate, the passive circuit elements including at least coplanar transmission lines with said thin conductive film as a grounding conductor;

forming openings penetrating through prescribed portions of said thin conductive film;

forming through-hole conductors having respective first and second ends penetrating through portions of said thin conductive film so that the first end of each through-hole conductor protrudes from a corresponding opening of said thin conductive film and the second end is in contact with one of a terminal and a grounding conductor of a passive circuit element;

preparing a semiconductor substrate having opposite first and second surfaces;

depositing a thin conductive film on the second surface of said semiconductor substrate;

forming active circuit elements having respective electrodes on the first surface of said semiconductor substrate:

attaching a heat sink to the second surface of said semiconductor substrate; and mounting said dielectric substrate on said semiconductor substrate with the second surface of said dielectric substrate facing the first surface of said semiconductor substrate and electrically connecting said through-hole conductors to electrodes of said active circuit elements.

* * * * *